United States Patent
Belot

(10) Patent No.: US 6,232,645 B1
(45) Date of Patent: May 15, 2001

(54) NOISE DECOUPLING FOR SEMICONDUCTOR DEVICE WITH BICMOS-TYPE SUBSTRATE

(75) Inventor: Didier Belot, Rives (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/466,727

(22) Filed: Dec. 17, 1999

(30) Foreign Application Priority Data

Dec. 17, 1998 (FR) .................................................. 98 15941

(51) Int. Cl.[7] .............................. H01L 29/00; H01L 29/47
(52) U.S. Cl. ......................... 257/516; 257/544; 257/531; 455/73; 330/303
(58) Field of Search .................................... 330/302, 303, 330/306, 307; 455/73; 257/528, 531, 499, 500, 516, 544

(56) References Cited

U.S. PATENT DOCUMENTS

| | | |
|---|---|---|
| 4,619,001 * | 10/1986 | Kane . |
| 5,321,299 * | 6/1994 | Ohkawa et al. . |
| 5,519,358 * | 5/1996 | Tserng . |
| 5,734,976 | 3/1998 | Bartschi et al. . |
| 5,742,091 * | 4/1998 | Hebert . |
| 5,818,880 * | 10/1998 | Kriz et al. . |
| 5,952,704 * | 9/1999 | Yu et al. . |
| 6,072,205 * | 6/2000 | Yamaguchi et al. . |

FOREIGN PATENT DOCUMENTS

WO 96/37041    11/1996   (WO) .

OTHER PUBLICATIONS

Copeland, M.A., "VLSI for Analog/Digital Communications", IEEE Communications Magazine, vol. 29, No. 5, May 1, 1991, pp. 25–30, XP000231082.

Burghartz, J.N., et al. "Integrated RF and Microwave Components in BiCMOS Technology", IEEE Transactions on Electron Devices, vol. 32, No. 9, Sep. 1, 1996, pp. 1559–1580, XP000636271.

Preliminary Search Report dated Aug. 30, 1999 with annex on French Application No. 9815941.

* cited by examiner

*Primary Examiner*—Stephen D. Meier
(74) *Attorney, Agent, or Firm*—Theodore E. Galanthay; Stephen C. Bongini; Fleit, Kain, Gibbons, Gutman & Bongini P.L.

(57) ABSTRACT

A semiconductor device of the type having an integrated circuit with connection terminals connected to metal pads by connecting wires is provided. The integrated circuit includes a semiconductor substrate having a lower portion on top of which there is an upper layer that is more heavily doped than the lower portion. A first block and a second block are produced in the upper part of the substrate, and decoupling means are arranged in the vicinity of the first block. The decoupling means include at least one decoupling circuit that is connected to the lower portion of the substrate and to a ground connection pad, and the decoupling circuit has a minimum impedance at a predetermined frequency. In one preferred embodiment, the decoupling circuit includes an inductive-capacitive resonant circuit having a resonant frequency substantially equal to the predetermined frequency. In another preferred embodiment, the decoupling means includes a plurality of decoupling circuits and each of the decoupling circuits has a minimum impedance at a different predetermined frequency. A mobile telephone apparatus that includes at least one such integrated circuit is also provided.

22 Claims, 5 Drawing Sheets

NOISE DECOUPLING FOR SEMICONDUCTOR DEVICE WITH BICMOS-TYPE SUBSTRATE

CROSS-REFERENCE TO RELATED APPLICATIONS

This application is based upon and claims priority from prior French Patent Application No. 98-15941, filed Dec. 17, 1998, the entire disclosure of which is herein incorporated by reference.

BACKGROUND OF THE INVENTION

1. Field of the Invention

The present invention relates to semiconductor devices, and more specifically to decoupling between a noise emitter and a noise-sensitive receiver that are in an integrated circuit formed on a substrate that is suited for BiCMOS technology.

2. Description of Related Art

The coupling noise inside an integrated circuit comes essentially from two sources, namely the electromagnetic coupling due to the package and the metal lines of the circuit, and the electrical coupling due to the substrate. The present invention is concerned with reducing the electrical coupling noise due to the substrate. When a noise emitter injects charges into the substrate, they are distributed uniformly and can then be picked up by a receiver whose operation may be perturbed if it is sensitive to this electrical noise. For example, a "noise emitter" in the context of this description can be a strong-signal transistor that injects charges into the substrate, and the charges can be picked up by a weak-signal transistor that then behaves as a noise-sensitive receiver.

As an exemplary environment, such coupling noise will be described in relation to the field of mobile telephones. After a radio frequency reception stage, a mobile telephone has a low-noise amplifier with transistors for processing signals of very low power, typically on the order of 1 nanowatt to 100 nanowatts. This low-noise amplifier is followed by a mixer for carrying out frequency transposition from a signal output by a voltage-controlled oscillator associated with a phase-locked loop, which receives a signal output by a local oscillator and has a frequency divider.

Typically, the voltage-controlled oscillator processes signals on the order of 100 mvolts while the phase-locked loop processes signals on the order of 200 mvolts and has (in particular for the digital portion) CMOS transistors powered at 3 volts. These signals typically have a power on the order of one watt, which is high when compared with the power of the signals processed by the low-noise amplifier. Therefore, in the substrate, there is high-frequency analog noise associated with the voltage-controlled oscillator, as well as wide-band digital noise associated with the phase-locked loop. The combination of these perturbations creates white noise whose power in decibels is liable to perturb the low-noise amplifier if all of these components are produced within the same integrated circuit.

One current solution for overcoming such problems is to produce the low-noise amplifier, the voltage-controlled oscillator, the phase-locked loop, and the mixer on separate integrated circuits. For example, the low-noise amplifier and the voltage-controlled oscillator can be produced on two separate circuits having gallium arsenide substrates, while the phase-locked loop and the mixer can be produced on a silicon integrated circuit, and more particularly one appropriate to BiCMOS technology (i.e., bipolar CMOS technology in which bipolar transistors are combined with insulated-gate complementary field-effect transistors). However, this solution causes an increase in the overall area of the device overall, and in its cost.

SUMMARY OF THE INVENTION

In view of these drawbacks, it is an object of the present invention to overcome the above-mentioned drawbacks and to provide a noise emitter and a noise-sensitive receiver within the same integrated circuit, while ensuring decoupling between the emitter and the receiver.

Another object of the present invention is to reduce or eliminate the coupling noise that propagates inside the substrate of an integrated circuit.

One embodiment of the present invention provides a semiconductor device of the type having an integrated circuit with connection terminals connected to metal pads by connecting wires. The integrated circuit includes a semiconductor substrate having a lower portion on top of which there is an upper layer that is more heavily doped than the lower portion. A first block and a second block are produced in the upper part of the substrate, and decoupling means are arranged in the vicinity of the first block. The decoupling means include at least one decoupling circuit that is connected to the lower portion of the substrate and to a ground connection pad, and the decoupling circuit has a minimum impedance at a predetermined frequency. In a preferred embodiment, the decoupling circuit includes an inductive-capacitive resonant circuit having a resonant frequency substantially equal to the predetermined frequency.

Another embodiment of the present invention provides a mobile telephone apparatus that includes at least one integrated circuit. The integrated circuit includes a semiconductor substrate having a lower portion on top of which there is an upper layer that is more heavily doped than the lower portion. A first block and a second block are produced in the upper part of the substrate, and decoupling means are arranged in the vicinity of the first block. The decoupling means include at least one decoupling circuit that is connected to the lower portion of the substrate and to a ground connection pad, and the decoupling circuit has a minimum impedance at a predetermined frequency. In one preferred embodiment, the decoupling means includes a plurality of decoupling circuits and each of the decoupling circuits has a minimum impedance at a different predetermined frequency.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
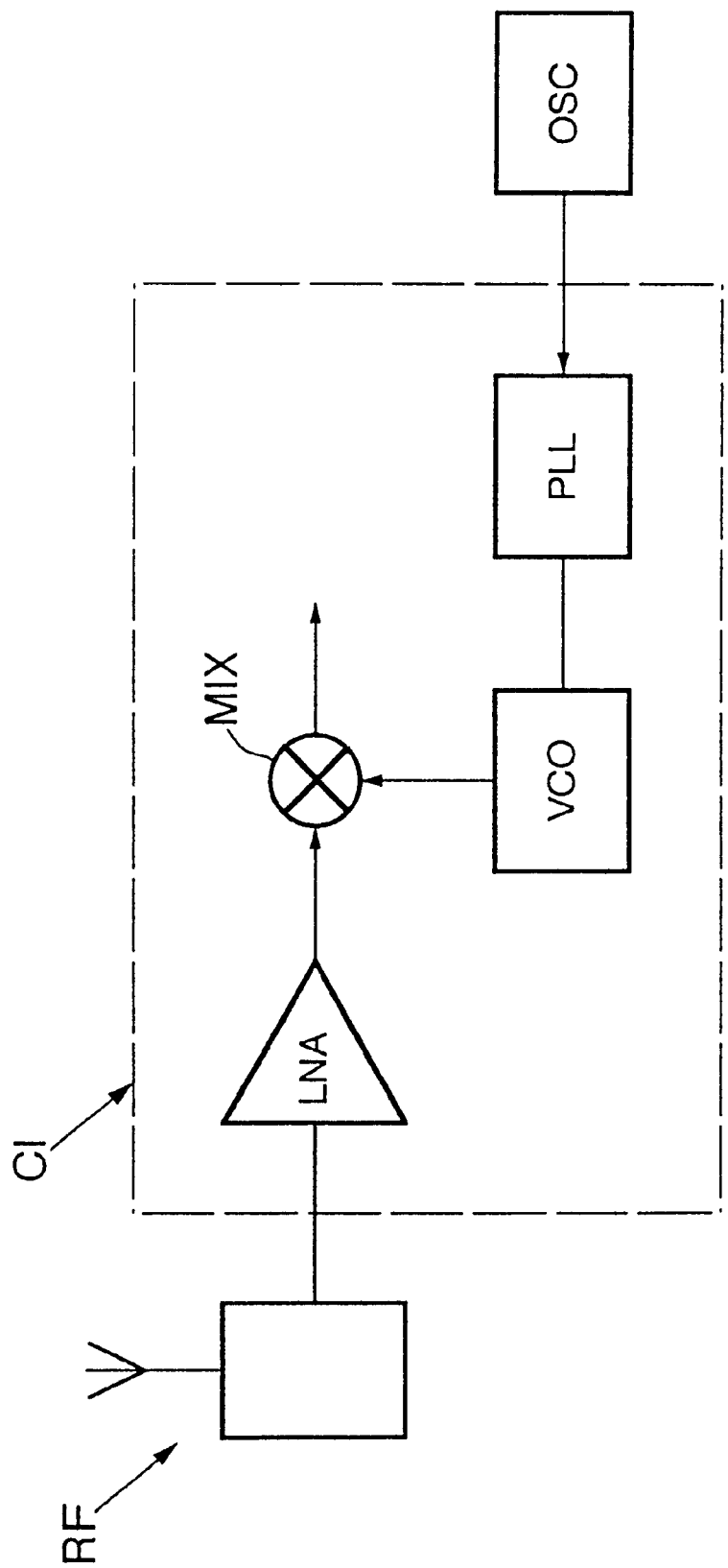
FIG. 1 is a block diagram of functional blocks within an integrated circuit according to one embodiment of the present invention that is particularly suited to mobile telephony applications.

Preferred embodiments of the present invention will be described in detail hereinbelow with reference to the attached drawings.

A preferred embodiment of the present invention provides a semiconductor device having, in resin encapsulation, an integrated circuit with connection terminals connected to metal pads by connecting wires. In general, the integrated circuit includes a semiconductor substrate having a lower part (for example, $P^-$-doped) on top of which there is an upper layer more heavily doped than the lower part (for example, $P^+$-doped). Thus, the substrate is particularly suited to BiCMOS technology.

Additionally, the integrated circuit has a "noise emitter" block (for example, a strong-signal transistor and/or a voltage-controlled oscillator and/or a phase-locked loop) and a "noise-sensitive" block (for example, a weak-signal transistor such as those associated with low-noise amplifiers). The emitter block and the receiver block are produced in the upper part of the substrate. (The term "block" is to be understood with a very general meaning in the context of the present invention. It may refer to a simple transistor or one or more functional blocks of a component that is produced within the integrated circuit.)

Furthermore, the integrated circuit has decoupling means that are arranged in the vicinity of the receiver block and include at least one decoupling circuit connected to the lower part of the substrate and a connection pad, which is typically a ground connection pad and that is connected to ground. The decoupling circuit has a minimum impedance at a predetermined frequency. In other words, a low-impedance path (with minimum impedance) is produced in the substrate at a predetermined frequency, for example 950 MHz in the case of a mobile telephony application. Thus, at the predetermined frequency, the charges injected into the substrate by the noise emitter will naturally take this minimum-impedance path and be discharged to ground.

At the predetermined frequency, this provides a reduction in the power of the noise. If the predetermined frequency corresponds to the frequency of the signals processed by the noise-sensitive receiver, the perturbations in its operation are minimized. Thus, narrow-band decoupling of the substrate is produced. In one preferred embodiment of the present invention, the decoupling circuit is an inductive-capacitive circuit having a resonant frequency substantially equal to the predetermined frequency. Thus, at the resonant frequency, the impedance of the resonant circuit is a minimum.

In a semiconductor package, the connection between the connection terminals of the integrated circuit and the outside is made by connecting wires that are welded between the connection terminals and the corresponding metal pads. In general, the connection incorporating the wire and the connection pad is generally inductive.

Further, according to one embodiment of the invention, the decoupling circuit includes a capacitor that is connected between the lower part of the substrate and a connection terminal of the integrated circuit, as well as inductive connecting means including the ground connection pad and at least one connecting wire connected between the connection terminal and the ground connection. The inductive value of the connection between the connection terminal and ground is known to within a percentage, generally to within less than 5%.

Further, if the predetermined frequency is selected as the frequency for which it is desired to have noise rejection below the level of the low-power signal that should not to be perturbed, the value of the capacitance corresponding to this resonant frequency can be deduced easily. This capacitance can be produced by various means, for example by producing a metal/metal capacitor between two metallization levels of the integrated circuit. One of the electrodes of the capacitor can be connected directly to the lower part of the substrate by a via, or the other electrode can also be connected by a via to an upper metallization level forming a connection terminal.

It is particularly advantageous for the capacitor to be formed by a reverse-biased diode that is produced by a semiconductor well formed in the upper layer of the substrate and in contact with the lower part of the substrate. This semiconductor well has an opposite type of conductivity than the lower part of the substrate. In such a case, the ground connection pad is intended to be connected to a dynamic ground whose DC voltage is adjustable. In particular, when a supply plane having a fixed voltage value is fairly wide, the capacitance of this plane relative to ground is very high and a short circuit is created between this supply plane and the ground plane when the frequency is high. This is known as "dynamic ground".

By obtaining a capacitor by producing a reverse-biased diode, there can be obtained a particularly precise adjustment of the value of the capacitance. Indeed, the surface dimensions (form factor and perimeter) make it possible to obtain a capacitance value very close to the desired value. Furthermore, the final adjustment of the value of the frequency at which the isolation (decoupling) will be a maximum can be obtained by modifying the value of the voltage of the external dynamic ground (cathode voltage of the diode).

When the frequency for which it is desired to have isolation of the noise is particularly high, for example of the order of 2400 MHz, the inductive connecting means can include multiple connecting wires connected between the connection terminal and the ground connection pad. This makes it possible to reduce the value of the inductance. Additionally, in certain applications, the signals intended to be processed by the noise-sensitive receiver or receivers can have different frequencies. Fir example, in mobile telephony, the need may arise to operate on transmission networks at 950 MHz, 1800 MHz, 2400 MHz, or more.

In such a case, the present invention makes it possible to produce wide-band decoupling of the substrate by using decoupling means having multiple decoupling circuits that have minimum impedances at different predetermined frequencies. For example, it is possible to produce various diodes whose surface dimensions may differ as a function of the desired working frequencies. In such an embodiment, it is particularly desirable for the decoupling circuits to be placed side by side between the noise-emitter block and the noise-sensitive receiver block. Furthermore, the decoupling circuit associated with the lowest frequency is preferably the one closest to the first block (noise emitter), while the decoupling circuit associated with the highest frequency is preferably the one closest to the second block (noise-sensitive).

In other words, the diode closest to the emitter is preferably the one with the maximum resonance because it is assigned to the lowest substrate resistance between the emitter and itself. Similarly, the diode furthest from the emitter is preferably the one with the minimum resonance coefficient because it is assigned to the highest substrate resistance. As in the embodiment described above, final adjustment of the frequency values at which the isolation is a maximum can be obtained by modifying the DC voltage values of the external dynamic grounds to which the various diodes are connected.

As described above, the decoupling means should be arranged in the vicinity of the receiver block so as to best isolate the noise-sensitive receiver. In fact, the closer the decoupling means are to the receiver, the better the isolation that is obtained. Generally, the distance between the decoupling means and the receiver block is between a few microns (connected with the fabrication technology) and a few tens, of microns (for example, 50 microns). It is known how to adjust this distance according to the specific application and the minimum acceptable noise rejection.

In preferred embodiments, the noise emitter block is produced in a first zone of the upper layer of the substrate, and the receiver block and the decoupling means are produced in a second zone of the upper layer of the substrate. Furthermore, it is particularly advantageous for the two zones to be mutually separated by a semiconductor barrier that is more heavily doped than the upper layer of the substrate and grounded. In combination with the decoupling means, such isolation makes it possible to obtain good noise rejection from low frequencies upwards.

FIG. 1 shows an integrated circuit according to one embodiment of the present invention for use in mobile telephony applications. In particular, the integrated circuit CI illustratively includes various elements of a reception stage of a mobile telephone. The integrated circuit CI includes a low-noise amplifier LNA that receives, from a radio frequency reception head RF, low power signals (typically, 1 nW to 1 $\mu$W) having an exemplary frequency of 950 MHz for connecting the mobile telephone with such a transmission network. Alternatively, other frequencies such as 1800 MHz, 2400 MHz, or 5200 MHz can be used.

The signals output by the low-noise amplifier LNA are mixed in a mixer MIX that also receives the output signal of a voltage-controlled oscillator VCO. The voltage-controlled oscillator delivers a signal centered on the input frequency (for example, 950 MHz) and is associated with a phase-locked loop PLL that typically has a digital frequency divider. A local oscillator OSC such as a quartz crystal delivers a reference frequency signal (typically 26 MHz) to the phase-locked loop. The frequency of the output signal of the mixer is close to 0 MHz. Here, the oscillator VCO induces noise centered around 950 MHz, while the phase-locked loop induces noise with a wider band.

Figure 2:
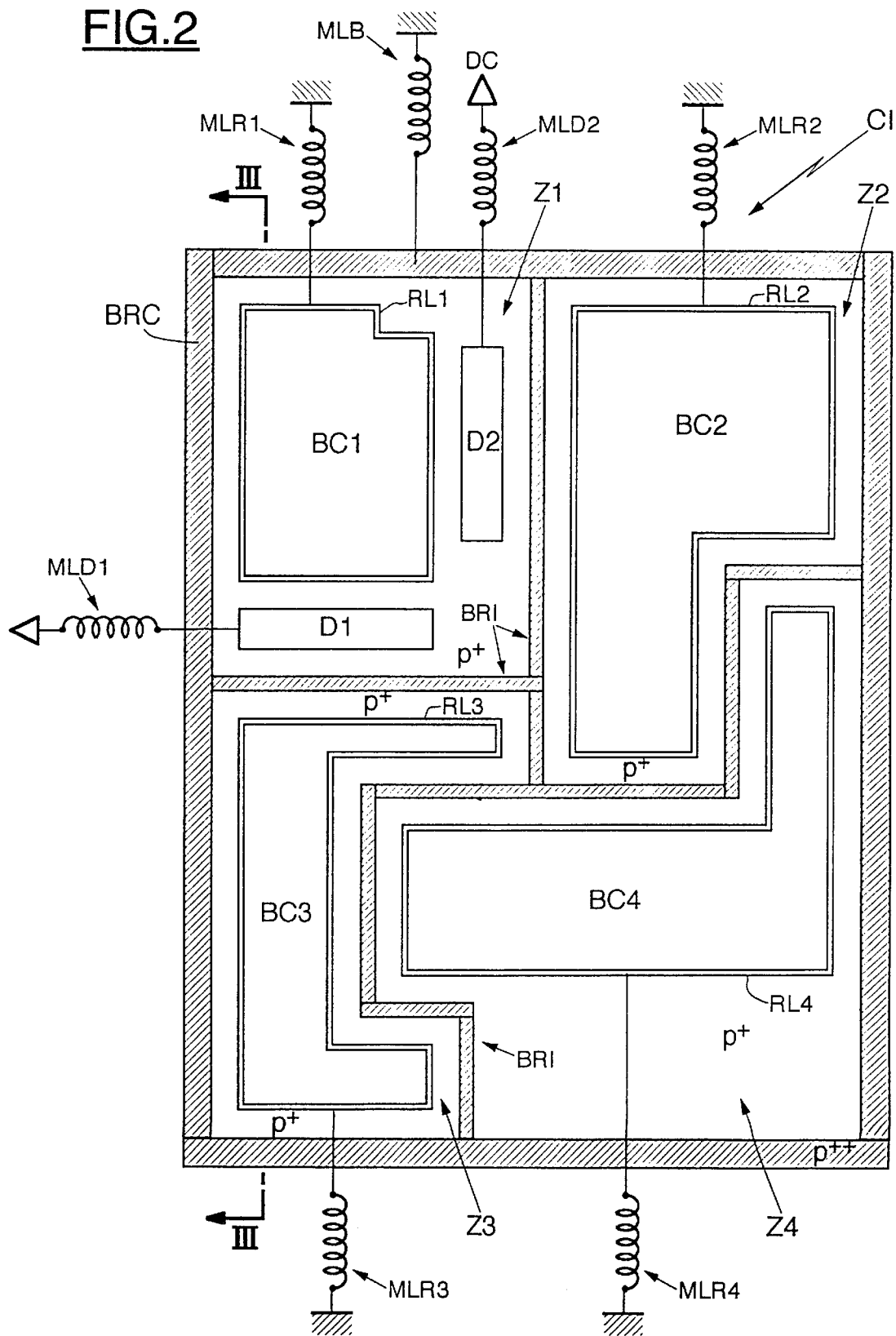
FIG. 2 is a diagram illustrating one arrangement for the blocks of FIG. 1 within the substrate of the integrated circuit.
Figure 3:
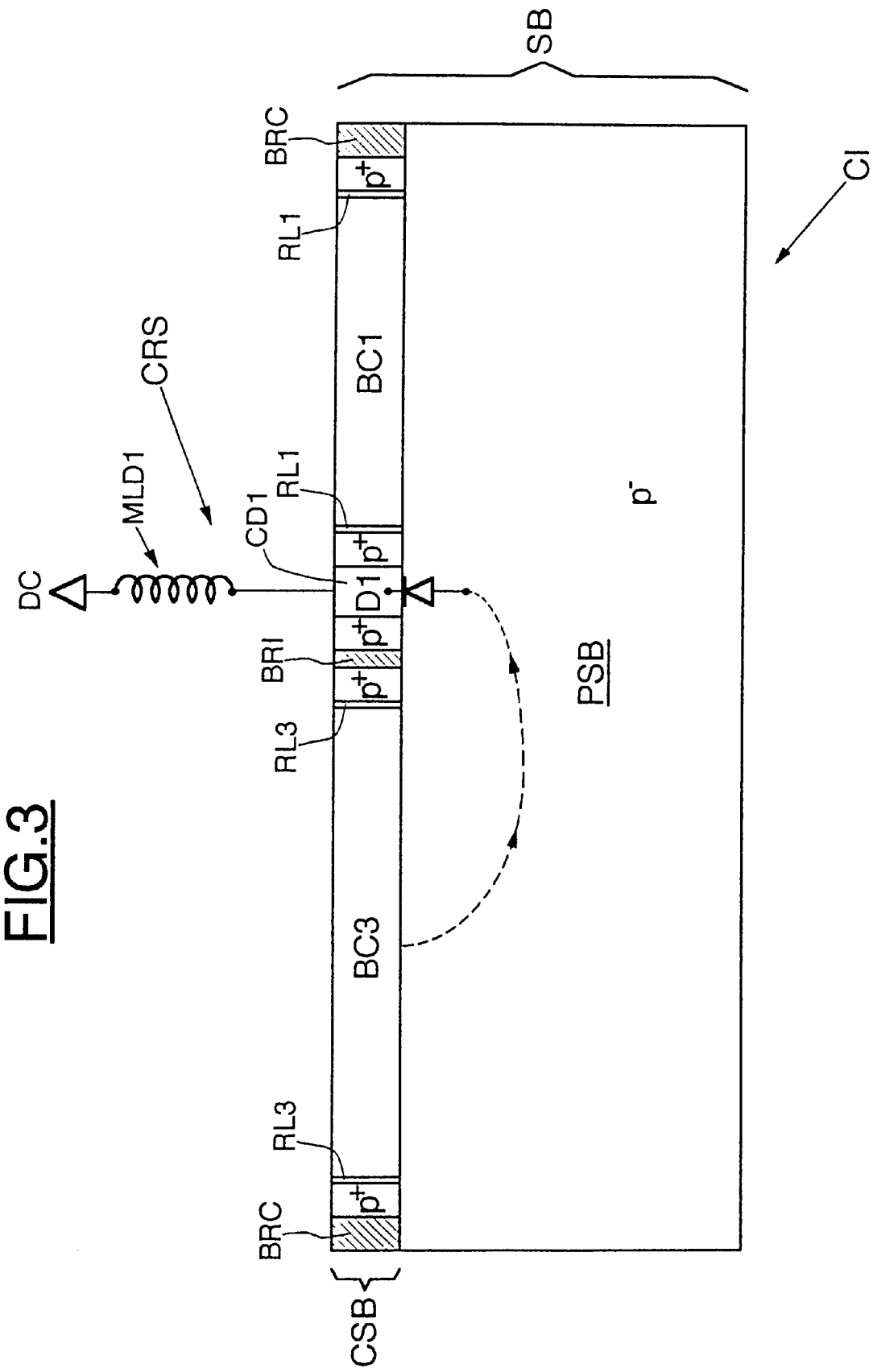
FIG. 3 shows a cross-sectional view taken along line III—III of FIG. 2.

FIG. 2 shows one arrangement for the blocks of FIG. 1 within the substrate of the integrated circuit, and FIG. 3 is a cross-sectional view taken along line III—III of FIG. 2. In the illustrated embodiment, the four substrate blocks BC1, BC2, BC3, and BC4 of FIGS. 2 and 3 respectively incorporate the amplifier LNA, the mixer MIX, the voltage-control oscillator VCO, and the phase-locked loop PLL. In general, the first block BC1 incorporates a noise-sensitive receiver, while the remaining blocks BC2, BC3, and BC4 are liable to emit noise (for example, white noise).

The substrate SB within which the integrated circuit CI is produced is useable in a BiCMOS process. In this regard, the exemplary substrate includes a lower portion that is lightly doped with the P type (i.e., P$^-$-doping, typically $10^{14}$ to $10^{15}$ dopant atoms cm$^{-3}$, with a resistivity of 15 ohms/cm) having a thickness typically on the order of 350 microns. The rear face of the substrate is generally grounded. In the front portion, the substrate SB has an upper layer CSB that is more heavily doped than the lower portion PSB. The upper layer CSB, also with P conductivity, typically has P$^+$-doping (for example, $10^{18}$ dopant atoms cm$^{-3}$, with a resistivity on the order of 0.2 ohms/cm). The thickness of the upper layer is typically on the order of 3 microns. The upper layer makes it possible to avoid a phenomenon of self-heating of the field-effect transistors (latch up phenomenon).

The integrated circuit's four zones Z1–Z4, within which blocks BC1–BC4 are produced, are mutually separated by a semiconductor barrier that includes a peripheral barrier BRC and internal barriers BRI. More specifically, the peripheral barrier BRC and the internal barriers BRI are semiconductor zones with the same conductivity type as the upper layer CSB, but are more heavily doped than this layer. The doping of the insulation barriers is thus P$^{++}$-doping (for example, $10^{20}$ atoms cm$^{-3}$). The entire semiconductor insulation barrier is connected to an external ground plane by connecting means MLB. The function of the insulation barrier will be explained in more detail below.

Furthermore, each semiconductor block BC is surrounded by a local semiconductor ring RL, which is also P$^{++}$-doped. The function of such a local ring is to create a substrate equipotential around the semiconductor block so as to avoid any risk of value offset of the threshold voltages of the MOS transistors incorporated in the block. In preferred embodiments of the present invention, each local ring RL is independently grounded through a connecting means MLR.

Furthermore, a diode D1 is arranged between the third block BC3 and the first block BC1, and is produced within the first zone Z1 of the integrated circuit in the vicinity of the first block BC1. Similarly, a second diode D2 is produced in the vicinity of the first block BC1, and is arranged between the second block BC2 and the first block BC1. The diodes D1 and D2, which are each connected to a dynamic ground DC via respective inductive connecting means MLD1 and MLD2, form two decoupling circuits that isolate the first block BC1 from the noise generated by the other blocks BC2, BC3, and BC4.

In particular, each diode (only diode D1 is represented in FIG. 3) has its cathode connected to the dynamic ground DC and its anode connected to the lower part of the substrate PSB. Typically, the diode may be produced by a well CD1 with opposite conductivity type to the lower part of the substrate (here an N well) that is obtained by epitaxy or implantation. Therefore, the PN junction of the diode lies at the interface between the lower part PSB of the substrate and the N-doped region. This diode forms a capacitor which, with the associated inductive connecting means MLD, produces a resonant decoupling circuit CRS whose impedance is a minimum at the resonant frequency.

The impedance of the decoupling circuit is, for a given angular frequency $\omega$, equal to $$R + jL\omega + \frac{1}{jC\omega}$$

where R denotes the resistance of the substrate between the emitter and the well CD1. At the resonant frequency, the impedance is a minimum and has the value R. If the resonant frequency of the decoupling circuit is adjusted to the frequency of the signals received by the first block BC1, a minimum-impedance path (illustrated by dashes in FIG. 3) is created for this frequency. The charges generated at this frequency in the lower part of the substrate by the noise-emitter blocks BC2, BC3, and BC4 are discharged through this path to ground.

Figure 4:
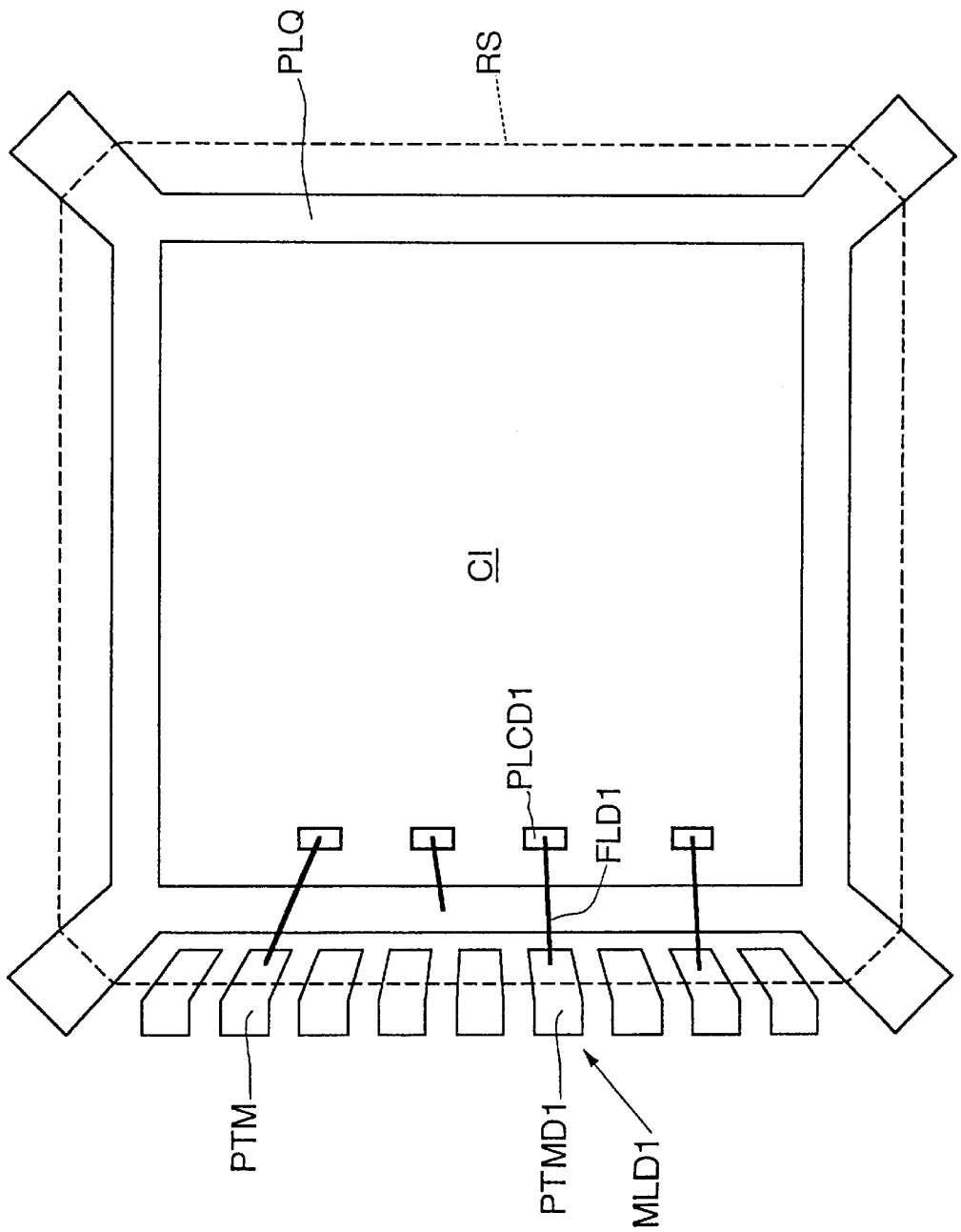
FIG. 4 is a diagram illustrating the inductive connecting means of the decoupling means according to one embodiment of the present invention.

FIG. 4 shows the inductive connecting means of the decoupling means according to one embodiment of the present invention. As shown, the integrated circuit conventionally rests on a central plate PLQ of a connection grid having metal connection pads PTM. The assembly is held in resin encapsulation RS. Further, connection terminals are formed on the surface of the integrated circuit and are connected by vias (metallic interconnection holes) to the various active components of the integrated circuit.

These various connection terminals can either be connected to the central plate PLQ or directly to the metal pads PTM using welded connecting wires. The connecting wires and the associated metal connection pads form inductive connecting means whose inductance value can be known to within a few percent. Typically, the inductive value of a connecting wire is on the order of 3 nanohenries, while the inductive value of the metal connection pads is on the order of 2 nanohenries. If ω denotes the angular frequency associated with the working frequency F (ω=2 πF), the capacitance C is then obtained by the following formula.

$$C = \frac{1}{L\omega^2}$$

In practice, the size of the well and its form factor are determined in a known manner so as to obtain the value of the capacitance. Then, a fine adjustment of the resonant frequency of the resulting resonant circuit is carried out by adjusting the value of the voltage DC supplying the connection pad PTMD1 that connected to the connection terminal PLCD1, which is connected to diode D1. In other words, a fine adjustment is made in the working frequency at which it is desired to obtain noise rejection. The same procedure is adopted for diode D2. Further, the diodes D1 and D2 are preferably placed in the vicinity of the noise-sensitive block BC1. The closer these diodes are to the first block BC1, the better the isolation that is obtained. In practice, it has been observed that a distance of between a few microns and a few tens of microns gives satisfactory results.

Figure 5:
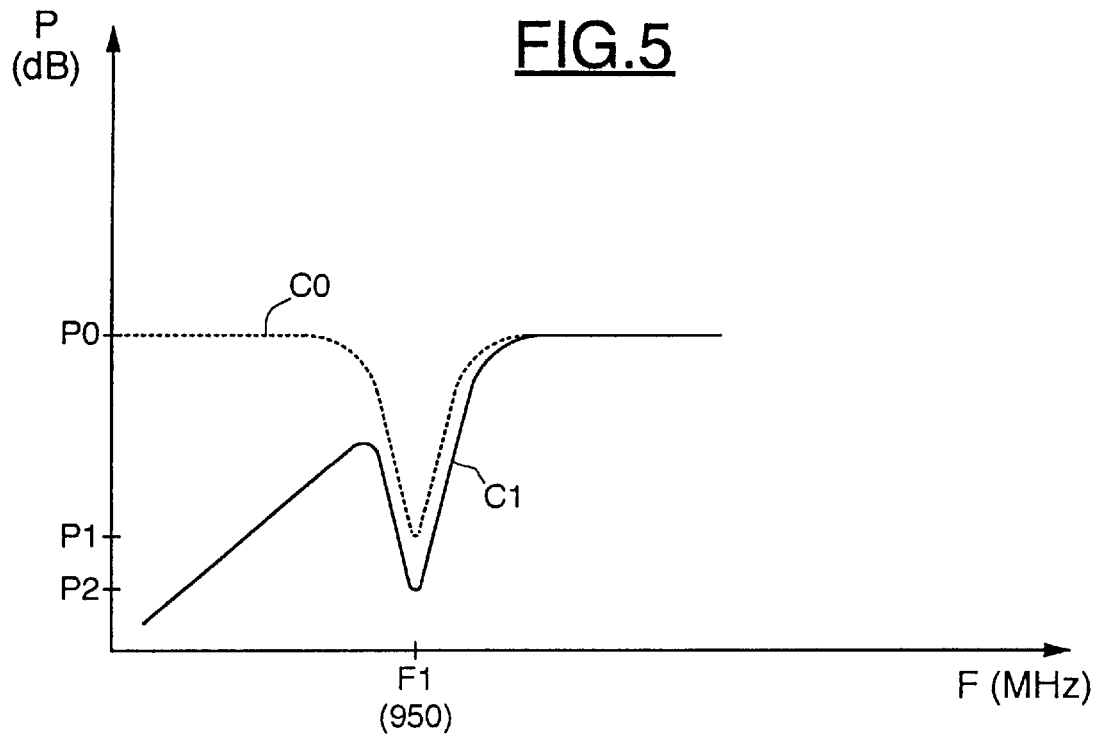
FIG. 5 is a graph illustrating the noise rejection obtained by one device according to the present invention.

FIG. 5 illustrates the noise rejection. If the noise emitter block (or blocks) creates white noise having a power level P0 in the substrate and the frequency of the signals received and processed by the first block BC1 is frequency F1 (for example, 950 MHz), the diodes D1 and D2 are dimensioned so as to obtain a resonant circuit whose resonant frequency corresponds to frequency F1. In the absence of the insulating barriers BRC and BRI, the curve CO in FIG. 5 is obtained. Thus, there is a reduction of the power of the noise to a first level P1 that lies below the sensitivity level of the first block BC1 (here, the low-level amplifier). However, the presence of the insulating barriers BRC and BRI that are connected to the external ground and the independently grounded local rings makes it possible to obtain the curve C1. As shown, this curve exhibits good rejection even at low frequencies and makes it possible to obtain a second noise level P2 that is even lower than the first level P1 at frequency F1.

Figure 6:
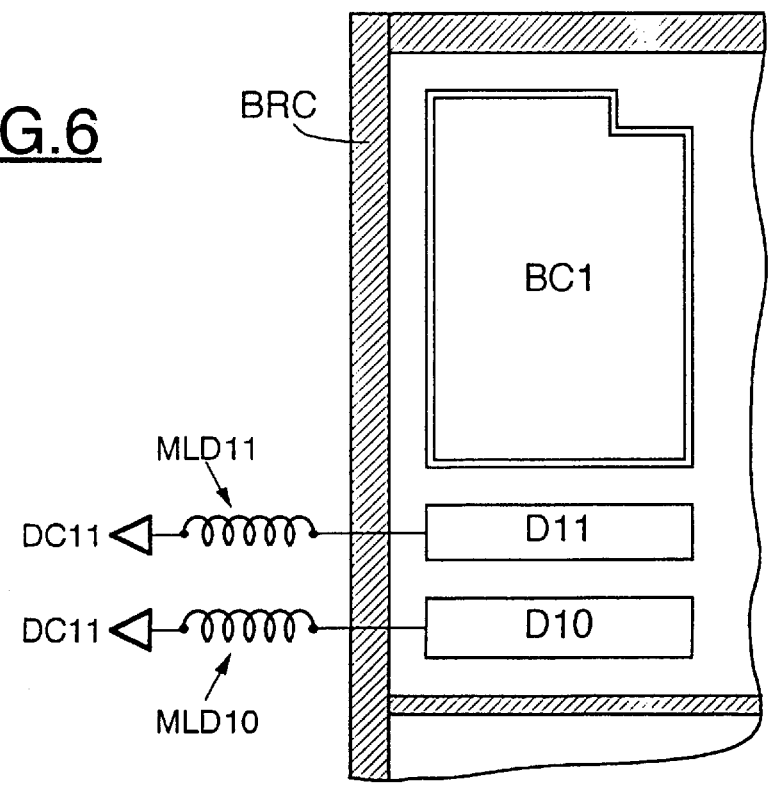
FIG. 6 is a diagram illustrating a portion of a device according to another embodiment of the present invention.

When the noise-sensitive block is to process signals that have different working frequencies (for example, a mobile telephone that can connect to a network at 950 MHz, 1800 MHz, 2400 MHz, or 5200 MHz), the present invention makes it possible to provide wide-band decoupling of the substrate. More precisely, as illustrated in FIG. 6, the decoupling means are composed of as many resonant circuits as there are working frequencies. For simplicity, only two diodes D10 and D11 have been represented in FIG. 6 (corresponding to the frequencies 950 MHz and 1800 MHz, respectively). In general, the distance between the diode closest to the first block BC1 is between a few microns and a few tens of microns. The diode associated with the lowest working frequency is arranged furthest away from the first block BC1, while the diode associated with the highest working frequency is arranged closest to the first block BC1. Thus, a set of frequencies for which the isolation is a maximum is obtained.

Accordingly, the present invention makes it possible to substantially improve isolation while using an inexpensive package. In particular, isolation is improved by using diodes of specific sizes and by placing them between one or more blocks that emit white noise and another block that is sensitive to noise over a frequency band. The present invention is particularly suited to the field of mobile telephones.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A semiconductor device of the type having an integrated circuit with connection terminals connected to metal pads by connecting wires, said integrated circuit comprising:
   a semiconductor substrate having a lower portion on top of which there is an upper layer that is more heavily doped than the lower portion,
   wherein a first block and a second block are produced in the upper part of the substrate, and
   decoupling means are arranged in the vicinity of the first block, the decoupling means including at least one decoupling circuit that is connected to the lower portion of the substrate and to a ground connection pad, the decoupling circuit having a minimum impedance at a predetermined frequency.

2. The semiconductor device as defined in claim 1, wherein the decoupling circuit includes an inductive-capacitive resonant circuit having a resonant frequency substantially equal to the predetermined frequency.

3. The semiconductor device as defined in claim 2, wherein the decoupling circuit includes:
   a capacitor connected between the lower portion of the substrate and a connection terminal of the integrated circuit; and
   inductive connecting means connected to the connection terminal, the inductive connecting means including the ground connection pad and at least one connecting wire.

4. The semiconductor device as defined in claim 3, wherein the inductive connecting means includes a plurality of connecting wires that are connected between the connection terminal and the ground connection pad.

5. The semiconductor device as defined in claim 3, wherein the capacitor is formed by a reverse-biased diode that is formed by a semiconductor well in the upper layer of the substrate and in contact with the lower portion of the substrate, the semiconductor well having an opposite type of conductivity than the lower portion of the substrate.

6. The semiconductor device as defined in claim 5, wherein the ground connection pad is connected to a dynamic ground whose DC voltage is adjustable.

7. The semiconductor device as defined in claim 5, wherein the surface dimensions of the semiconductor well define the value of the capacitance.

8. The semiconductor device as defined in claim 1, wherein the decoupling means includes a plurality of decoupling circuits and each of the decoupling circuits has a minimum impedance at a different predetermined frequency.

9. The semiconductor device as defined in claim 8,
wherein the decoupling circuits are placed side by side between the first block and the second block,
the decoupling circuit associated with the lowest predetermined frequency is closest to the second block, and
the decoupling circuit associated with the highest predetermined frequency is closest to the first block.

10. The semiconductor device as defined in claim 1, wherein the distance between the decoupling means and the first block is between one micron and tens of microns.

11. The semiconductor device as defined in claim 1,
wherein the first block and the decoupling means are produced in a first zone of the upper layer of the substrate,
the second block is produced in a second zone of the upper layer of the substrate, and
the first and second zones are mutually separated by a semiconductor barrier that is more heavily doped than the upper layer of the substrate.

12. The semiconductor device as defined in claim 11, wherein the semiconductor barrier is grounded.

13. A mobile telephone apparatus including at least one integrated circuit, said integrated circuit comprising:
a semiconductor substrate having a lower portion on top of which there is an upper layer that is more heavily doped than the lower portion,
wherein a first block and a second block are produced in the upper part of the substrate, and
decoupling means are arranged in the vicinity of the first block, the decoupling means including at least one decoupling circuit that is connected to the lower portion of the substrate and to a ground connection pad, the decoupling circuit having a minimum impedance at a predetermined frequency.

14. The mobile telephone apparatus as defined in claim 13, wherein the decoupling circuit includes an inductive-capacitive resonant circuit having a resonant frequency substantially equal to the predetermined frequency.

15. The mobile telephone apparatus as defined in claim 14, wherein the decoupling circuit includes:
a capacitor connected between the lower portion of the substrate and a connection terminal of the integrated circuit; and
inductive connecting means connected to the connection terminal, the inductive connecting means including the ground connection pad and at least one connecting wire.

16. The mobile telephone apparatus as defined in claim 15, wherein the inductive connecting means includes a plurality of connecting wires that are connected between the connection terminal and the ground connection pad.

17. The mobile telephone apparatus as defined in claim 15, wherein the capacitor is formed by a reverse-biased diode that is formed by a semiconductor well in the upper layer of the substrate and in contact with the lower portion of the substrate, the semiconductor well having an opposite type of conductivity than the lower portion of the substrate.

18. The mobile telephone apparatus as defined in claim 17, wherein the ground connection pad is connected to a dynamic ground whose DC voltage is adjustable.

19. The mobile telephone apparatus as defined in claim 13, wherein the decoupling means includes a plurality of decoupling circuits and each of the decoupling circuits has a minimum impedance at a different predetermined frequency.

20. The mobile telephone apparatus as defined in claim 19,
wherein the decoupling circuits are placed side by side between the first block and the second block,
the decoupling circuit associated with the lowest predetermined frequency is closest to the second block, and
the decoupling circuit associated with the highest predetermined frequency is closest to the first block.

21. The mobile telephone apparatus as defined in claim 13,
wherein the first block and the decoupling means are produced in a first zone of the upper layer of the substrate,
the second block is produced in a second zone of the upper layer of the substrate, and
the first and second zones are mutually separated by a semiconductor barrier that is more heavily doped than the upper layer of the substrate.

22. The mobile telephone apparatus as defined in claim 21, wherein the semiconductor barrier is grounded.

* * * * *